US011107962B2

(12) United States Patent
Hsieh et al.

(10) Patent No.: US 11,107,962 B2
(45) Date of Patent: Aug. 31, 2021

(54) UV LED ARRAY WITH POWER INTERCONNECT AND HEAT SINK

(71) Applicant: Soulnano Limited, Hong Kong (HK)

(72) Inventors: Hung Hsin Hsieh, Kaohsiung (TW); Cho Hang Wong, Hong Kong (HK)

(73) Assignee: Soulnano Limited, Hong Kong (HK)

( * ) Notice: Subject to any disclaimer, the term of this patent is extended or adjusted under 35 U.S.C. 154(b) by 71 days.

(21) Appl. No.: 16/576,752

(22) Filed: Sep. 19, 2019

(65) Prior Publication Data

US 2020/0194646 A1 Jun. 18, 2020

Related U.S. Application Data

(60) Provisional application No. 62/832,286, filed on Apr. 11, 2019, provisional application No. 62/780,946, filed on Dec. 18, 2018.

(51) Int. Cl.
*H01L 33/64* (2010.01)
*H01L 33/62* (2010.01)
*H01L 25/075* (2006.01)

(52) U.S. Cl.
CPC ........ *H01L 33/647* (2013.01); *H01L 25/0753* (2013.01); *H01L 33/62* (2013.01); *H01L 33/648* (2013.01)

(58) Field of Classification Search
CPC ..... H01L 33/647; H01L 33/648; H01L 33/62; H01L 25/0753; H01L 33/644; H01L 23/32; H01L 23/3672; H01L 23/3677; H01L 23/4006; H05B 33/0803; H05B 45/30; H05K 1/0274; H05K 3/0303; F21S 41/19; F21S 41/141; F21S 41/153; Y02P 70/50; B60K 1/04; B60K 1/02; B60K 7/0007;

(Continued)

(56) References Cited

U.S. PATENT DOCUMENTS

2004/0085736 A1* 5/2004 Petit .................... H01L 23/4006 361/704
2004/0173901 A1 9/2004 Mallik et al.

(Continued)

OTHER PUBLICATIONS

Office action of corresponding Taiwan Patent Application No. 108146534 dated Dec. 18, 2020.

*Primary Examiner* — Mouloucoulaye Inoussa
(74) *Attorney, Agent, or Firm* — Idea Intellectual Limited; Margaret A. Burke; Sam T. Yip

(57) ABSTRACT

A heat sink and power interconnect for a UV LED array are provided. A first circuit is disposed on a surface of a first substrate. A UV LED array is positioned thereon. A second substrate and second circuit are spaced apart from the first substrate and a first heat sink is positioned adjacent thereto. An aperture passes through each of the first substrate, the second substrate, and the heat sink. An electrical insulator lines the aperture with an electrically and thermally conductive liner positioned adjacent to the electrical insulator. A fastener is positioned in the aperture and electrically interconnects the first circuit and the second circuit through the electrically and thermally conductive liner and electrically communicates with an external power supply. The fastener carries one or more of a power or an electrical signal, and dissipates heat through the electrically and thermally conductive liner to the heat sink.

18 Claims, 7 Drawing Sheets

POWER SUPPLY

SECTION (TOTAL)

(58) Field of Classification Search
CPC ...... H01R 13/73; H01R 12/82; H01R 12/704; B66F 9/07572; F16B 19/1045; F16B 5/0266
USPC .......... 257/713, E23.084, E23.103; 362/363, 362/249.02; 361/704, 707, 709, 720, 810
See application file for complete search history.

(56) References Cited

U.S. PATENT DOCUMENTS

2009/0266512 A1* 10/2009 Lu ....................... H01L 23/4006 165/80.3
2013/0051020 A1* 2/2013 Yasuoka ................. F21V 11/02 362/249.02
2013/0200977 A1* 8/2013 Miyazaki ............ H01F 17/0013 336/192
2013/0229801 A1* 9/2013 Breidenassel ............. F21K 9/68 362/235
2014/0124915 A1* 5/2014 Hayashi .................. H01L 25/18 257/713
2015/0117033 A1* 4/2015 Chiu ................... F21V 19/0055 362/363
2015/0338082 A1* 11/2015 Hu ....................... H05K 1/0204 362/373
2018/0177007 A1* 6/2018 Mehnert ................. F21S 41/19

* cited by examiner

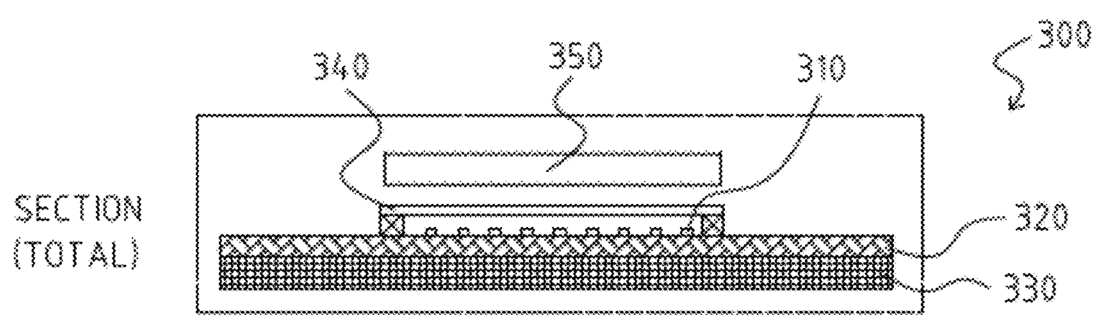
FIG. 3A
Section A
FIG. 3B
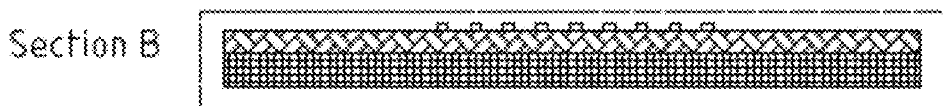
FIG. 3C
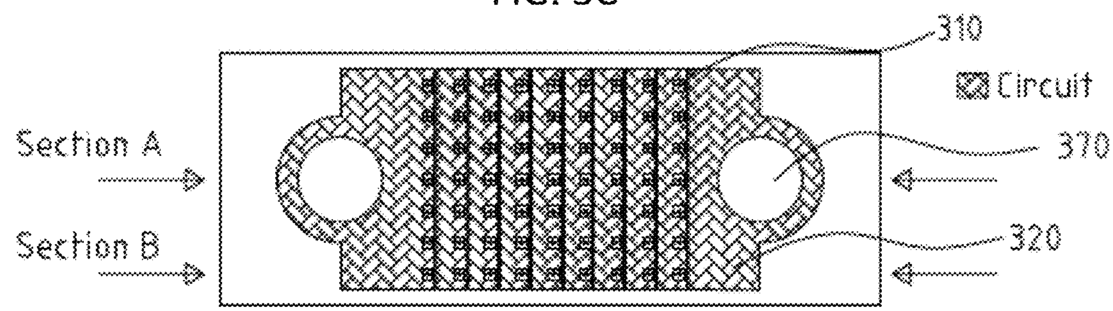
FIG. 3D
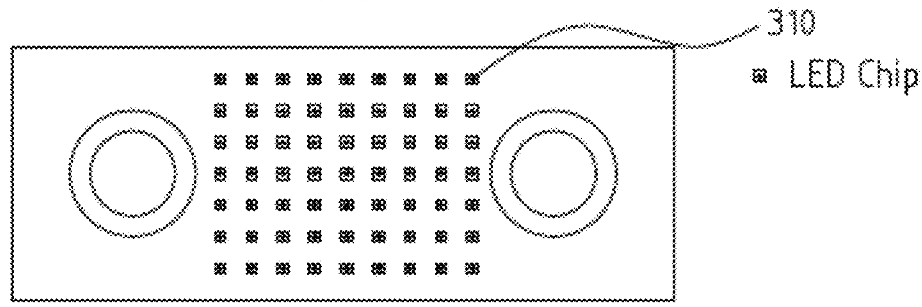
FIG. 3E
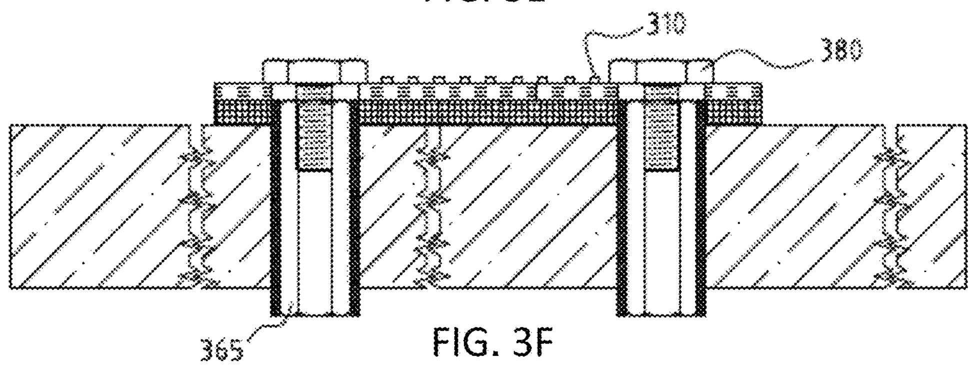
FIG. 3F

UV LED ARRAY WITH POWER INTERCONNECT AND HEAT SINK

CROSS-REFERENCE TO RELATED APPLICATIONS

This application claims priority from (1) U.S. Provisional Patent Application Ser. No. 62/780,946 filed Dec. 18, 2018; and (2) U.S. Provisional Patent Application Ser. No. 62/832,286 filed Apr. 11, 2019, and the disclosures of which are incorporated herein by reference in their entirety.

FIELD OF THE INVENTION

The present invention relates to electrical connections in device layouts and, more particularly to electrical connections in high power device layouts such as UV LED arrays.

BACKGROUND

Many electronic devices and electrical equipment use a variety of wire-based connectors for communication with power supplies or with other electrical devices. However, as the footprint of these devices becomes smaller, there is a higher power density and wired connections can be difficult to establish and maintain. Further, high power densities may create high amounts of heat that can damage solder connections holding wires. For example, conventional LEDs use various wired connections between a power source and the LED module. However, this wire connection is a source of failure, particularly for solder connections, terminals with wires, or connectors with wire connections that may weaken due to thermal fatigue or mechanical strain. Wire connections are also a source of defective products during manufacturing. In contrast to conventional lighting approaches, LED lighting technologies have relatively high efficiency, which generates less heat. However, the newly-developed UV LEDs generating some very short wavelengths below 400 nm typically have a relatively low conversion efficacy, thus generating large amount of heat. In order to improve the efficient and maintain a compact structure, a new design to integrate the power path and heat dissipation functions is important. As used herein, the term "UV" is broadly construed to relate to all forms of UV ration, including UV, UV-A, UV-B, UV-C near UV, etc. In general, the term "UV" will apply to wavelengths from approximately 10 nm to approximately 440 nm.

In traditional techniques for UV applications, organic materials (e.g. electric cable insulation jackets, insulation materials of connectors, sockets or terminals) would normally be used as the connecting materials. However, UV light as well as the heat will cause degradation under the long-term exposure of the short wavelength illumination, therefore, new designs are needed that improve heat dissipation while facilitating compact design.

Current UV arrays may employ ceramic substrates, to reduce thermal effect, but there are drilled holes for connection if connectors are used. Too much heat may generate the risks of cracking on the locations of connectors.

Further, when LEDs are used in large arrays, considerable heat is generated due to the high power density concentrated in a small area. This heat, particularly the extreme thermal cycling as the devices are heated and cooled, may damage conventional connections. Additionally, unstable connections may fail such as those due to poor soldering or misalignment of wires and solder.

LED arrays also generate substantial amounts of light. In some cases, the amount of light generated may be two orders of magnitude greater than full sunlight in the middle of the day. This amount of light may also damage soldered wire connections, causing power failures in LED arrays.

Therefore, there is a need in the art to have improved electrical connections between LEDs and power sources.

Further, there is a need for improved interconnect structures for other systems currently connected by wires. That is, an improved interconnect structure has numerous applications beyond LEDs and LED arrays.

There is a further need to improve efficiency and maintain compact device structures, and, in particular, a need for a new design to integrate a power path with heat dissipation functions.

SUMMARY OF THE INVENTION

The present invention provides a heat sink and power interconnect for a UV LED array. A first substrate is selected from a printed circuit board, ceramics, or glass-ceramics material. A first circuit is disposed on a surface of the first substrate. A UV LED array is positioned on a portion of the first circuit or on the surface of the first substrate, the UV LED electrically communicating with the first circuit.

A second substrate is spaced apart from the first substrate with a second circuit disposed on a surface of the second substrate. At least a first heat sink that is configured to dissipate heat from the UV LED array is positioned adjacent to at least one or both of the first substrate and the second substrate. An aperture passes through each of the first substrate, the second substrate, and the heat sink. An electrical insulator lines the aperture with an electrically and thermally conductive liner positioned adjacent to the electrical insulator.

An electrically- and thermally-conductive fastener is positioned in the aperture and contacting the electrically- and thermally-conductive liner such that the fastener electrically interconnects the first circuit and the second circuit through the electrically and thermally conductive liner and electrically communicates with an external power supply, carrying one or more of power or an electrical signal, and dissipates heat through the electrically and thermally conductive liner to the at least first heat sink.

BRIEF DESCRIPTION OF THE DRAWINGS

FIG. 3A-3F schematically depict a UV LED array with a fastener interconnect according to an embodiment of the present invention;

DETAILED DESCRIPTION

Figure 1:
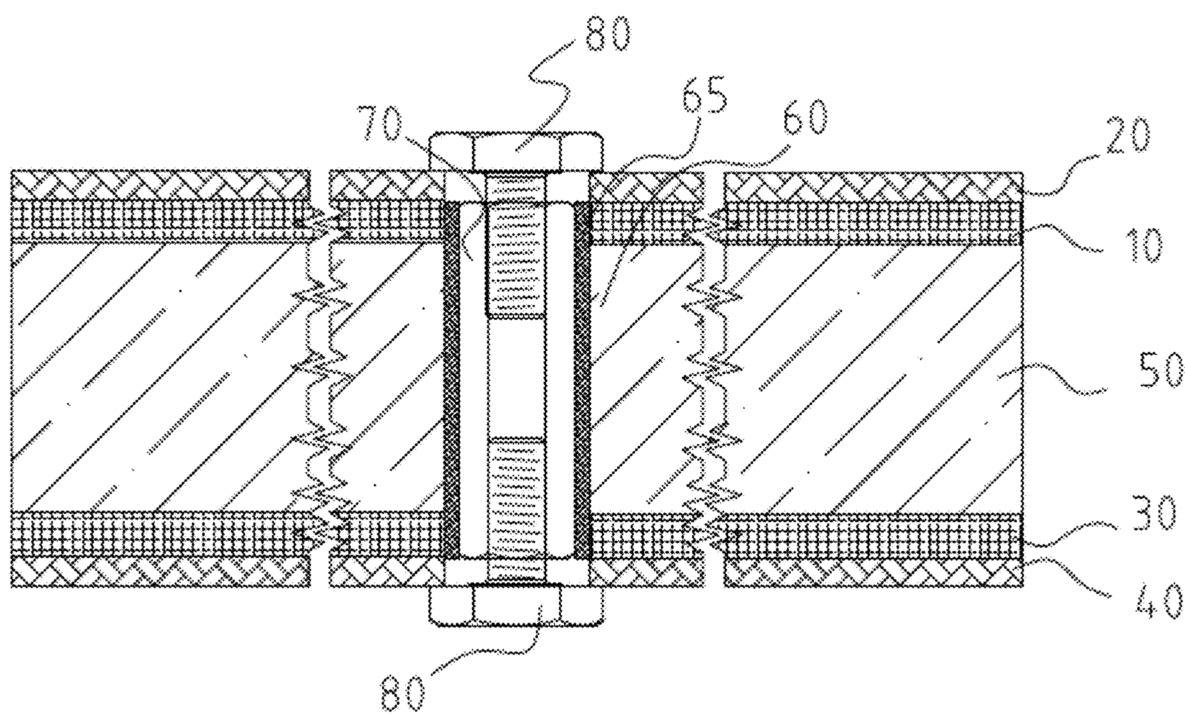
FIG. 1 schematically depicts a fastener interconnect according to an embodiment of the present invention.

Turning to the drawings in detail, FIG. 1 depicts an overview of a conductive fastener assembly that overcomes the shortcomings of conventional wiring. The conductive fastener is mechanically robust and easily assembled with circuit boards and other substrate materials. As discussed in further detail below, the fastener may interconnect between a circuit that connects to an LED (or other devices that needs to communicate with a power supply) and other circuits that may be positioned on another surface of the circuit board or substrate or be positioned on another substrate.

In the example of FIG. 1, a first substrate 10 may be selected from printed circuit boards such as FR-X (PCB) or CEM-X (PCB) or may be a ceramic such as aluminum nitride, silicon carbide, or alumina/sapphire. Other non-electrically-conductive substrates may also be selected such as certain polymers, glass-ceramics, or metals with insulating ceramic or polymer layers positioned thereon. A conductive material 20 is positioned on substrate 10 and may be patterned into a first electrical circuit. A second substrate 30 is positioned apart from the first substrate 10. Like substrate 10, substrate 30 may be selected from printed circuit boards, ceramic, or other non-conductive materials. A further conductive layer 40 is positioned on second substrate 30 and may be patterned into a second electrical circuit. The conductive layers may be copper, gold, silver, or alloys thereof or any other material with sufficient conductivity to carry electrical signals or power to a device positioned on the substrates or the conductive layers.

In FIG. 1, substrates 10 and 30 are positioned on either side of a thermally conductive material core/heat sink 50. Typically, the core is selected from a metal core such as aluminum alloy, aluminum, copper, copper alloy, or stainless steel, however other conductive materials, including non-metals, may be used. Although the substrates are positioned on either side of the conductive material core/heat sink, other configurations are also acceptable including those where one or both substrates do not directly contact the heat sink or contact the heat sink through one or more intermediate layers.

An aperture 60 passes through the first and second substrates 10, 30, the first and second conductive layers 20, 40, and the heat sink 50. An electrical insulator 65 lines the aperture with an electrically and thermally conductive liner 70 positioned adjacent to the electrical insulator. The electrical insulator 65 may be a ceramic or polymer insulator although other insulating materials may also be used. The electrically and thermally conductive liner may be a metal such as copper, copper alloys, aluminum, aluminum alloys, nickel, steel or conductive non-metals.

An electrically- and thermally-conductive fastener 80 is positioned in the aperture 60 where it contacts the electrically- and thermally-conductive liner 70 such that the fastener 80 electrically interconnects the first circuit (conductor 20) and the second circuit (conductor 40) through the electrically and thermally conductive liner 70. The fastener 80 may be, for example, a threaded fastener such as a screw or bolt, or it may be an unthreaded fastener.

Figure 2:
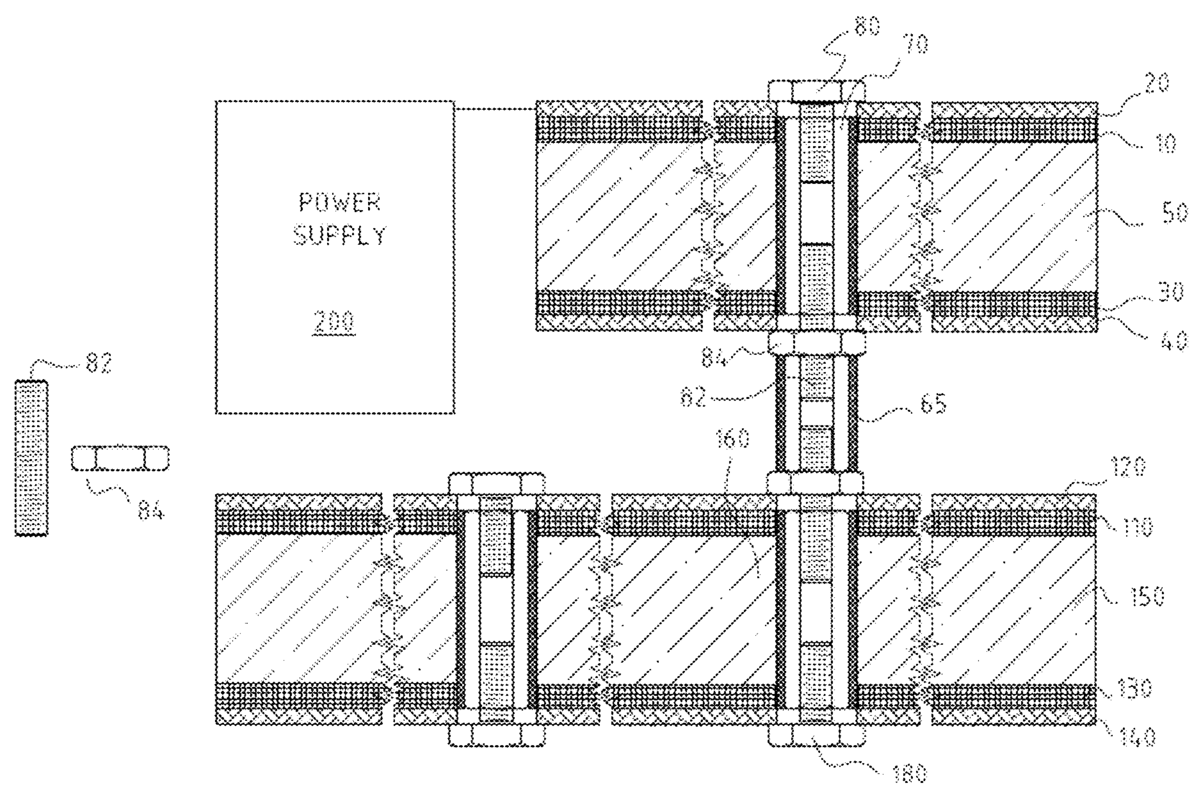
FIG. 2 schematically depicts a fastener interconnect according to a further embodiment of the present invention.

As seen in FIG. 2, additional circuits and heat sinks may also be interconnected for more complex multilayer structures. In FIG. 2, the electrically- and thermally-conductive liner 70 extends through a second aperture 160 that passes through a second heat sink 160 and third and fourth substrates, 110 and 130, respectively. These third and fourth substrates include third and fourth conductive layers (optionally patterned into circuits), elements 120 and 140, respectively in FIG. 2. Although not shown in FIG. 2, it is understood that further substrates and circuits, with or without additional heat sinks, may be interconnected through the electrically- and thermally-conductive liner and fasteners 80, 180.

In the embodiment of FIG. 2, the circuit boards are separated by heat sinks and also air.

However, another heat sink may be located between boards 30 and 110. Other objects (e.g., additional substrate material) nay be used to maintain or fix all structures in a stable state physically. Note that each substrate may include more than one circuit. The quantity of fasteners is selected based on the circuits interconnecting on the substrates. For existing high power-consumption electronic devices, there are numerous wires which contain signals or current and those wires increase the system complexity, make maintenance or repair of the system difficult, and are sources of potential system failure. The, the conductive fastener interconnect system improves reliability. The fastener 80 may be a unitary/integrated structure with a head and shank or the head and shank may be separable as shown with head 84 and shank 82. Head 84 may be a nut that can engage one or more shanks as depicted in the interconnection of the two structures in FIG. 2. Note that, although not depicted, the use of the shank alone without a head portion may be desirable in some circuit configurations. That is, the use of the term "fastener" is in a broad sense of any element that can connect parts and does not denote a particular structure. The fastener functions as a mechanical, electrical, and thermal connector. When using a two-part fastener, the installation of the fastener may be different than for a one-part fastener, that is, the shank portion 82 may be inserted into an aperture and then the head be attached. A single head may interconnect with multiple shanks which may be separately assembled and then joined together with the head.

The fasteners and electrically- and thermally conductive liner 70 electrically communicate with an external power supply 200. The liner 70 carries one or more of power or an electrical signal, and dissipates heat through the electrically and thermally conductive liner to the first heat sink 50 (and, in FIG. 2, to second heat sink 150).

FIGS. 3A-3F depict the system of FIG. 1 employed in a UV LED array 300 according to an aspect of the present invention. UV LED array 300 includes a plurality of UV LEDs 310 arranged in rows (although other arrangements may also be used) on a substrate 330. A circuit 320 is positioned on a substrate 330. Depending upon the type of UV LEDs, the LEDs 310 are positioned on the substrate 330 or on the circuit 320 or partially on the circuit and partially on the substrate 330. In FIG. 3A, a glass cover 340 is optionally positioned over the UV LEDs 310. Above the glass cover is positioned an optional lens or array of lenses or diffuser elements 350.

As seen in FIGS. 3A, 3D, and 3F, apertures 370 are provided through substrates 330. As seen in these FIGS., the conductive circuit 320 contacts the conductive fastener 380 which then conducts power or signals through conductive liner 365.

Figure 4:
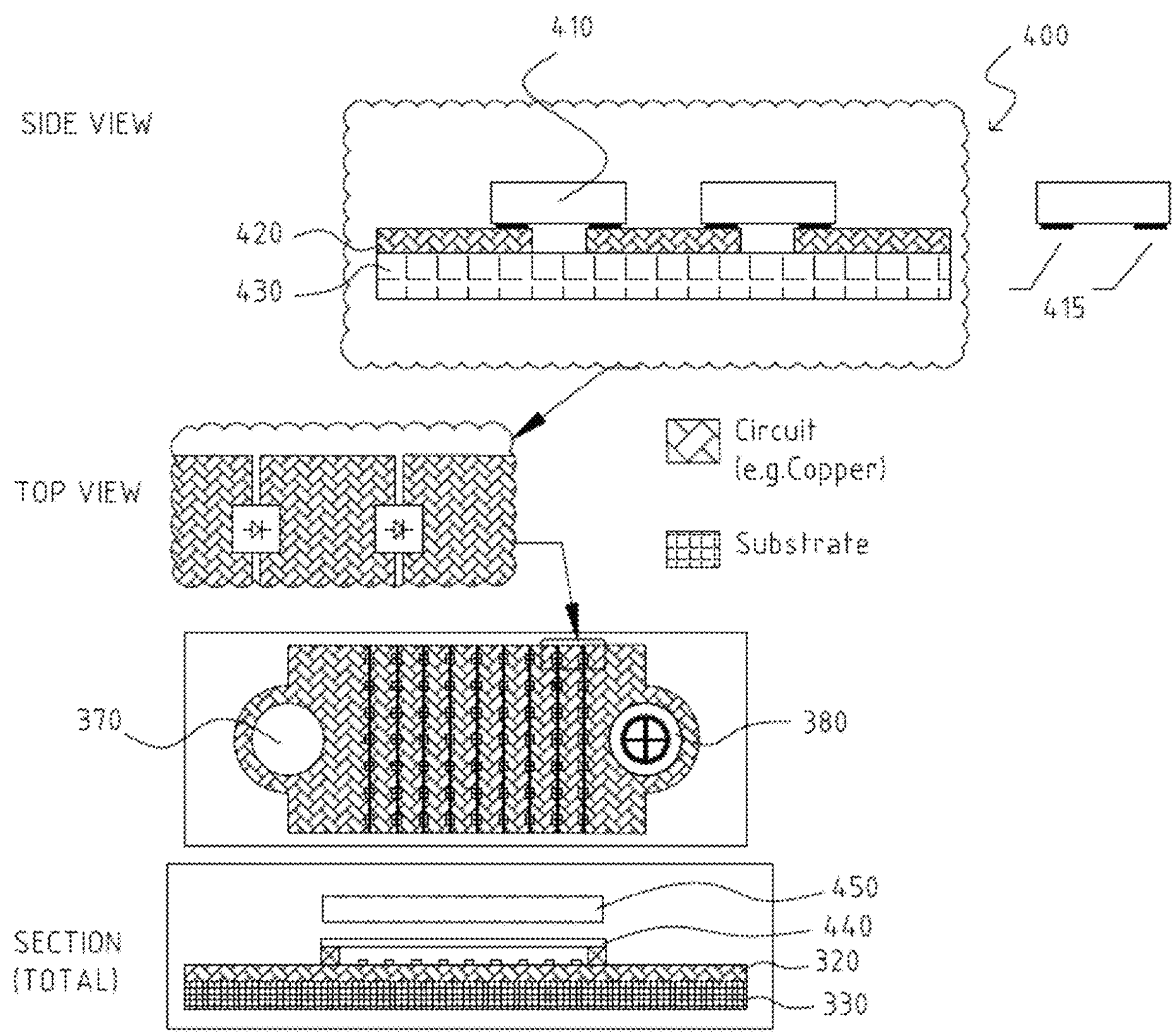
FIG. 4 schematically depicts a UV LED array with fastener interconnect according to a further embodiment of the present invention.

FIG. 4 depicts an aspect of a UV LED array 400 using "flip chip" bonding to further eliminate wire bond connections. The UV LEDs 410 include bonding pads 415 that connect to circuits 420 disposed on substrate 430.

The UV LED array with the conductive fastener system may be used in a variety of UV lithography apparatuses, such as those depicted in U.S. Pat. No. 9,128,387 and US Patent Application 2010/0283978, the disclosures of which are incorporated by reference herein. Alternatively, the UV LED arrays of FIGS. 3 and 4 may be used in UV curing systems and UV medical devices. Basically, the UV LED array incorporating the inventive conductive fastener interconnect system can be used in any device requiring a UV source, and particularly useful for devices that require a high-intensity UV source.

The flexibility of the present invention provides excellent reliability performance, which is especially suitable for high power density applications (for example, greater than 30 watts/cm$^2$ in some embodiments and greater than 60 watts/cm$^2$) in other embodiments. It is also suitable for working-area-dependent applications for UV LED arrays such as UV curing, offset printing, UV sources for lithography, or thin-film heat generators. The configuration of the connection permits advanced thermal management techniques to be employed including cooling tubes for gas or water which may optionally be embedded in the thermal conductivity layer. Further, the conductive fastener connection system may be used with irregularly-shaped substrates and circuit patterns.

The LED interconnect system is used in a variety of LED applications such as lighting. In particular, the system is useful for LED-array based lighting such as for tubes used to replace conventional fluorescent light bulbs, and other lighting that is designed to replace incandescent lights. In general, all lighting applications that currently use wires to supply power to the LED can substitute the conductive fastener and conductive tube structures to power individual LEDs or LED arrays.

In summary, the interconnect system of the present invention may be used with (i) high current, high power consumption applications (for example, from 1 amp to approximately 20-30 A) and with (ii) small working area that results in high energy density and power density (can be used up to the thermal limit of selected substrate or sub mount of a power-consuming device); (iii) the conductive fasteners are used as a connection interface, with the performance and reliability being superior to traditional soldering or connectors or terminals methods.

Figure 5:
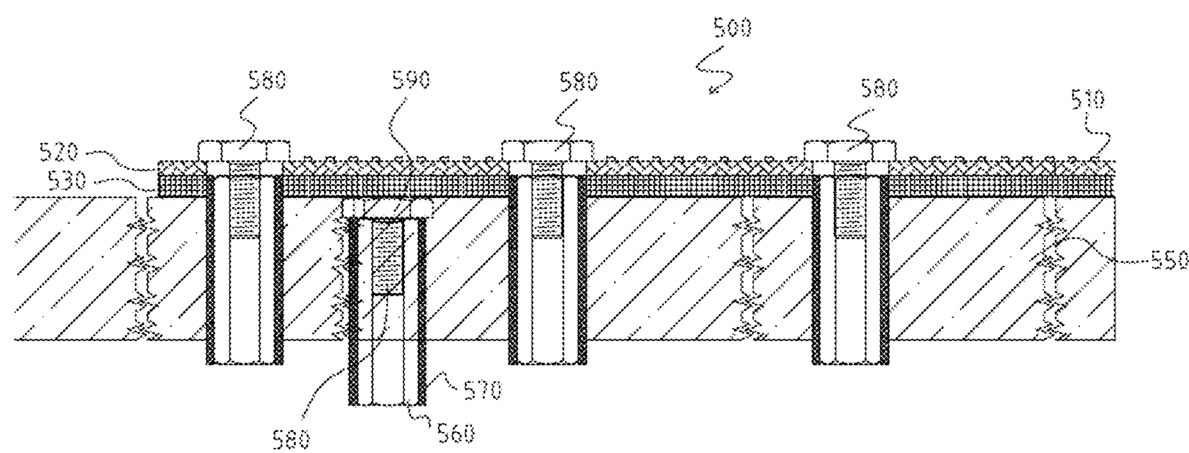
FIG. 5 schematically depicts a thermocouple probe with fastener interconnect according to an embodiment of the present invention.

FIG. 5 depicts another application of the interconnect system of the present invention. FIG. 5 depicts a high-thermal-energy generating device 500, such as an array of UV LEDs 510 (although any other high-thermal-energy generating device may be used). The device 500 includes a conductive circuit layer 520 and a substrate layer 530. An optional heat sink layer 550 may also be included. In one aspect, a thermocouple 590 associated with a fastener 580, insulator 570 and thermally- and electrically-conducting liner 560 senses temperatures beneath substrate 530 while other thermocouples may sense temperatures on the surface of substrate 530.

Figure 6:
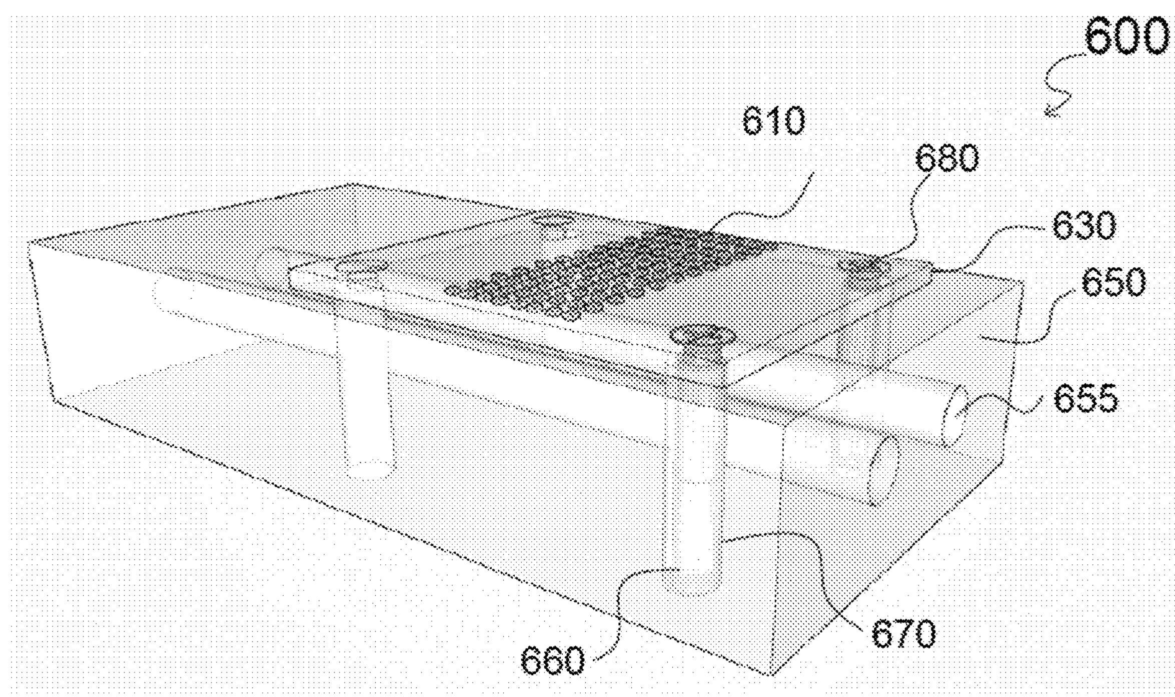
FIG. 6 schematically depicts details of an actively-cooled heat sink with fastener interconnects according to an embodiment of the present invention.

FIG. 6 depicts an embodiment of the present invention using an actively-cooled heat sink. FIG. 6 depicts a high-thermal-energy generating device 600, such as an array of UV LEDs 610 (although any other high-thermal-energy generating device may be used). A substrate 630 is positioned adjacent an actively-cooled heat sink 650. The fastener interconnect system of fastener 680, insulating sleeve 670 and electrically- and thermally-conducting liner 660 is positioned in an aperture that passes through the substrate 630 and the heat sink 650. Active cooling conduits 655 are positioned in the heat sink 650 and may carry cooling fluid such as cooling gas or cooling liquid through the heat sink 650. In this manner, a greater amount of heat may be dissipated than for passively-cooled heat sinks. Note that the actively-cooled heat sink of FIG. 6 may be used with any of the other embodiments of the present invention that employ a heat sink.

Figure 7A:
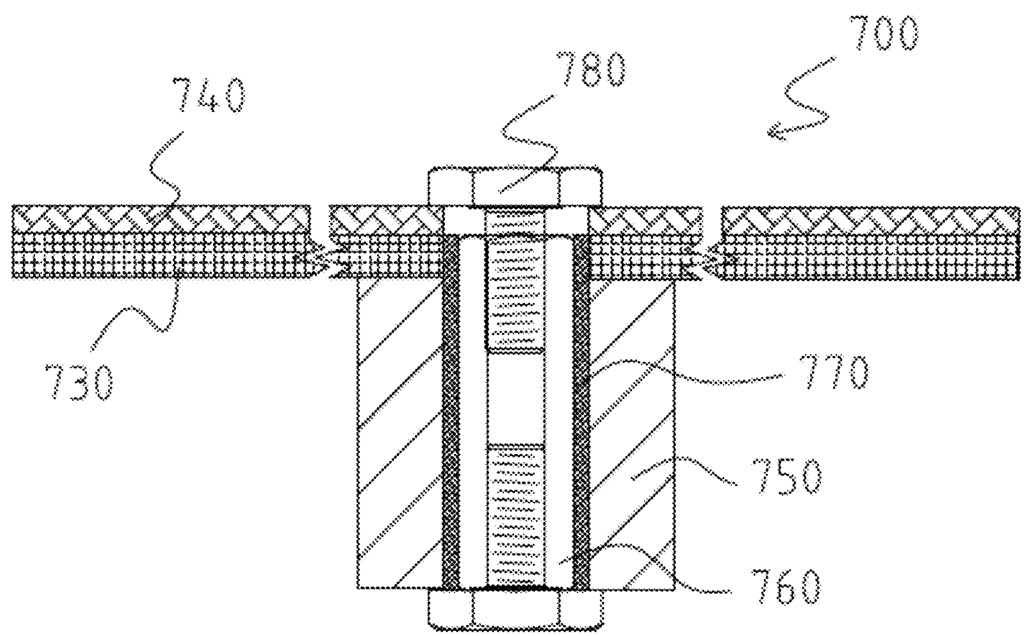
FIG. 7A schematically depicts a cross-sectional view of a thin-film heater with fastener interconnect according to an embodiment of the present invention.
Figure 7B:
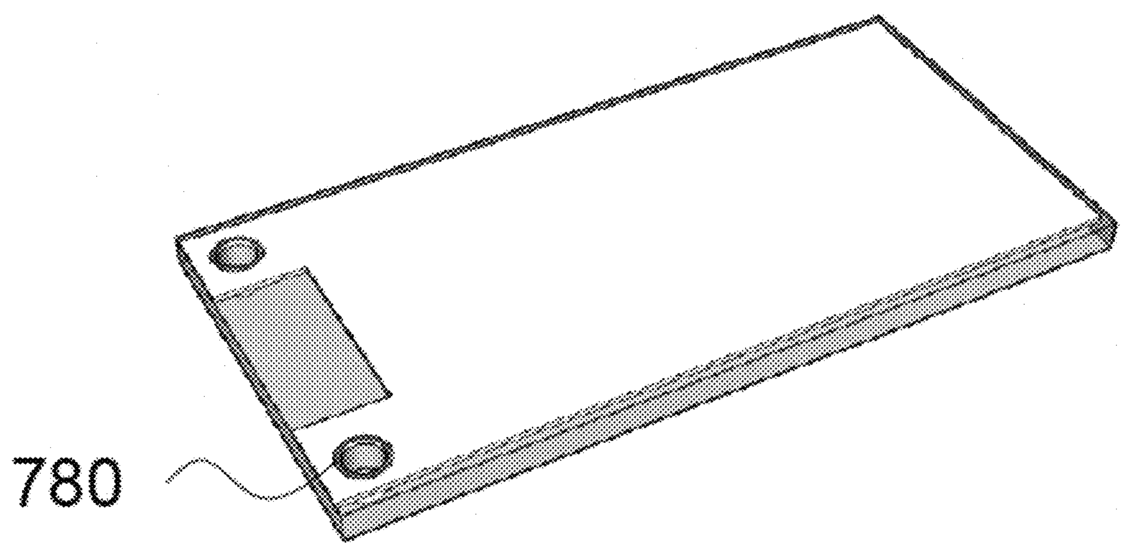
FIG. 7B schematically depicts a perspective view of a thin-film heater according to an embodiment of the present invention.

FIGS. 7A and 7B depict a thin-film heater 700 employing the interconnect system of the present invention. As seen in these FIGS., a resistance heating thin film conductive layer 740 is disposed on substrate 730; the substrate may be an insulating substrate such as glass or ceramic or glass-ceramic material. The resistance heating layer may be a nickel-chrome alloy (e.g., an alloy of approximately 80 percent nickel and 20 percent chrome) or any other resistive-heating material (e.g., aluminum, aluminum alloys, indium tin oxide, tantalum nitride). The fastener 780 passes through substrate 730 and into an aperture in element 750; element 750 may be thermally-conductive and act as a heat sink. The aperture includes a sleeve of insulator 770 and electrically- and thermally-conductive liner 760.

In summary, the present invention has particular application with UV modules/power modules for UV sources or arrays that have high current levels, for example, current of approximately 1 A-2 A up to a current of approximately 100 A. A particular current load capability is dependent on various criteria such as voltage, working area, fastener dimension, types of substrate materials, and the voltage/current relationship. Further, small working areas can use the fasteners of the present invention with space reduction over conventional wire bonds. For example, an LED module with dimensions of approximately 4×5 cm, 20 cm$^2$, around 60-100 W with a 3-5 W/cm$^2$ (for an M3 screw size) electrical power density are easily accommodated by the fastener systems of FIGS. 1 and 2. It is understood that larger fasteners such as M5 and M10 screw sizes may accommodate proportionately larger power densities.

Other applications for the conductive fastener interconnect system include facilitating interconnection between batteries used, for example, in electrical motor applications. Other applications include as interconnections in modules in data centers (e.g., to interconnect racks in data centers). The interconnect system may also be used with other high-power consumptions such as lasers or certain high-power semiconductor devices. The broad applications for the present invention can eliminate many of wires, terminals or connectors in present electronic assemblies.

Advantages of the present invention include high reliability, particularly long-term reliability under the harsh conditions of high exposure to UV and repeated thermal cycling. It is also resistant to vibration and aging conditions. Since it eliminates various solder connections, there is no wire classification and maintenance is simple as the fasteners may be easily removed and replaced. The working area is also improved as fasteners may be recessed from the device surface. Numerous other applications may incorporate the fastener interconnect system including power electronics, battery-to-battery connections, replacement of wires in rack systems, fan assemblies, etc.

Further, a lower amount of interface area can be achieved on the circuit substrates. Advantageously, heat dissipation would be limited at the interface materials like glue, device soldering points, compared with the prior art designs that have connectors or terminals or some wires. The use of the inventive fastener interconnection can reduce the risks of cracking because the surface area of the fastener is larger than the prior art connectors or other prior art interconnecting methods. Thus, the inventive fastener interconnection that reduces the interface is important to improve the heat dissipation issues and improve the reliability, extending the service life of the devices that use the fasteners.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated.

The invention claimed is:

1. A heat sink and power interconnect for a UV LED array, comprising:

a first substrate selected from an electrically insulating material or an electrically conductive material with one or more electrically-insulating layers positioned thereon, a first circuit disposed on a surface of the first substrate;

a UV LED array positioned on a portion of the first circuit or on the surface of the first substrate; the UV LED array electrically communicating with the first circuit;

a second substrate spaced apart from the first substrate;

a second circuit disposed on a surface of the second substrate;

at least a first heat sink configured to dissipate heat from the UV LED array; the heat sink positioned adjacent to at least one or both of the first substrate and the second substrate;

an aperture passing through each of the first substrate, the second substrate, and the at least first heat sink;

an electrical insulator lining the aperture;

an electrically and thermally conductive liner positioned adjacent to the electrical insulator;

a fastener positioned in the aperture and contacting the electrically and thermally conductive liner, the fastener electrically interconnecting the first circuit and the second circuit through the electrically and thermally conductive liner and electrically communicating with an external power supply, the fastener carrying one or more of power from the power supply or an electrical signal, and dissipating heat through the electrically and thermally conductive liner to the at least first heat sink.

2. The heat sink and power interconnect for a UV LED array according to claim 1, wherein the heat sink is positioned adjacent to the first substrate and the second substrate such that the first substrate is positioned on a first surface of the heat sink and the second substrate is positioned on a second surface of the heat sink.

3. The heat sink and power interconnect for a UV LED array according to claim 1, wherein the second substrate is spaced apart from the heat sink.

4. The heat sink and power interconnect for a UV LED array according to claim 3, further comprising a second fastener cooperating with the second substrate.

5. The heat sink and power interconnect for a UV LED array according to claim 4, further comprising a second heat sink positioned adjacent to the second substrate.

6. The heat sink and power interconnect for a UV LED array according to claim 1, wherein the heat sink comprises one or metals selected from copper, aluminum, steel, stainless steel or alloys thereof.

7. The heat sink and power interconnect for a UV LED array according to claim 1, wherein each of the first and second substrates are independently selected from ceramics, glass-ceramics, polymers, or metals coated with electrically-insulating layers.

8. The heat sink and power interconnect for a UV LED array according to claim 1, wherein each of the first and second substrates are independently selected from printed circuit boards, alumina, silicon carbide, aluminum nitride, cordierite, or glass.

9. The heat sink and power interconnect for a UV LED array according to claim 1, wherein either the electrical insulator or the electrically and thermally conductive liner is a tube positioned in the aperture.

10. A combined interconnect and heat sink for high power devices, comprising:

a first substrate selected from an electrically insulating material or an electrically conductive material with one or more electrically-insulating layers positioned thereon;

a first circuit disposed on a surface of the first substrate;

a high heat-generating device selected from a device that uses current of 1 amp or more or a device that generates heat of greater than approximately 30 Watts/cm$^2$, the high-heat generating device selected from one or more of a UV LED, a visible LED, a laser, or a thin film heater positioned on a portion of the first circuit or on the surface of the first substrate and electrically communicating with the first circuit;

a second substrate selected from an electrically insulating material or an electrically conductive material with one or more electrically-insulating layers positioned thereon spaced apart from the first substrate;

a second circuit disposed on a surface of the second substrate;

a heat sink configured to dissipate heat from the high heat-generating device; the heat sink positioned adjacent to at least the first substrate or the second substrate;

an aperture passing through each of the first substrate, the second substrate, and the heat sink;

an electrical insulator lining the aperture;

an electrically and thermally conductive liner positioned adjacent to the electrical insulator;

a fastener positioned in the aperture and contacting the electrically and thermally conductive liner and wherein the fastener electrically interconnects the first circuit and the second circuit through the electrically and thermally conductive liner and electrically communicates with an external power supply, carrying one or more of power or an electrical signal, and dissipates heat through the electrically and thermally conductive liner to the heat sink.

11. The combined interconnect and heat sink for high power devices according to claim 10, wherein the heat sink is positioned adjacent to the first substrate and the second substrate such that the first substrate is positioned on a first surface of the heat sink and the second substrate is positioned on a second surface of the heat sink.

12. The combined interconnect and heat sink for high power devices according to claim 10, wherein the second substrate is spaced apart from the heat sink.

13. The combined interconnect and heat sink for high power devices according to claim 10, further comprising a second fastener cooperating with the second substrate.

14. The combined interconnect and heat sink for high power devices according to claim 12, further comprising a second heat sink positioned adjacent to the second substrate.

15. The combined interconnect and heat sink for high power devices according to claim 10, wherein each of the first and second substrates are independently selected from ceramics, glass-ceramics, polymers, or metals coated with electrically-insulating layers.

16. The combined interconnect and heat sink for high power devices according to claim 10, wherein the heat sink comprises one or metals selected from copper, aluminum, steel, stainless steel or alloys thereof.

17. The combined interconnect and heat sink for high power devices according to claim 10, wherein each of the first and second substrates are independently selected from printed circuit boards, alumina, silicon carbide, aluminum nitride, cordierite, or glass.

18. The combined interconnect and heat sink for high power devices according to claim 10, wherein either the electrical insulator or the electrically- and thermally conductive-liner is a tube positioned in the aperture.

* * * * *